US012620565B2

(12) United States Patent
Yamaguchi et al.

(10) Patent No.: US 12,620,565 B2
(45) Date of Patent: May 5, 2026

(54) SUBSTRATE PROCESSING APPARATUS

(71) Applicant: Tokyo Electron Limited, Tokyo (JP)

(72) Inventors: Tatsuya Yamaguchi, Nirasaki (JP);
Syuji Nozawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 368 days.

(21) Appl. No.: 18/332,843

(22) Filed: Jun. 12, 2023

(65) Prior Publication Data

US 2024/0021419 A1      Jan. 18, 2024

(30) Foreign Application Priority Data

Jun. 16, 2022    (JP) ................................. 2022-097025

(51) Int. Cl.
H01J 37/32 (2006.01)
B05D 1/00 (2006.01)

(52) U.S. Cl.
CPC .......... H01J 37/32834 (2013.01); B05D 1/60 (2013.01); H01J 37/32449 (2013.01); H01J 37/32715 (2013.01); H01J 2237/20235 (2013.01); H01J 2237/332 (2013.01)

(58) Field of Classification Search
CPC ........... H01J 37/32834; H01J 37/32449; H01J 37/32715; H01J 2237/20235; H01J 2237/332; C23C 16/4405; C23C 16/4408; C23C 16/4412; B05D 1/60
USPC .......... 118/715; 156/345.29, 345.33, 345.34; 204/298.07
See application file for complete search history.

(56) References Cited

U.S. PATENT DOCUMENTS

| 2008/0233291 A1* | 9/2008 | Chandrasekaran | .... B41M 5/265 427/299 |
| 2012/0009765 A1* | 1/2012 | Olgado | ............. C23C 16/45565 257/E21.09 |
| 2015/0302990 A1* | 10/2015 | Ghosh | .................... H01G 4/206 428/141 |
| 2019/0122872 A1* | 4/2019 | Ghosh | ................. C23C 16/4408 |
| 2019/0390347 A1* | 12/2019 | Yamaguchi | ....... H01L 21/67253 |
| 2020/0098561 A1* | 3/2020 | Nozawa | ........... H01L 21/02271 |
| 2020/0101490 A1* | 4/2020 | Nozawa | ............. C23C 16/4557 |

FOREIGN PATENT DOCUMENTS

WO        20081299525 A1    10/2008

* cited by examiner

*Primary Examiner* — Rodney G McDonald
(74) *Attorney, Agent, or Firm* — Armstrong Teasdale LLP

(57) ABSTRACT

A substrate processing apparatus includes: a processing container; a stage provided in an interior of the processing container to place a substrate on the stage; an exhaust space arranged around the stage along an inner wall of the processing container; a first exhaust path provided between a processing space above the stage and the exhaust space and having a smaller conductance than the processing space; and a second exhaust path provided between a lower space below the stage and the exhaust space and having a smaller conductance than the processing space. A processing gas supplied into the processing space is exhausted via the first exhaust path, a purge gas supplied into the lower space is exhausted via the second exhaust path, and the second exhaust path is connected to the first exhaust path or to a space that is closer to the exhaust space than the first exhaust path.

8 Claims, 12 Drawing Sheets

FIG. 6

| Purge gas flow rate | 100sccm | 200sccm | 400sccm | 800sccm | 1600sccm |
|---|---|---|---|---|---|
| Film thickness distribution | | | | | |
| Average | 13.0 | 12.4 | 11.9 | 11.1 | 9.7 |
| D/R | 1.3 | 1.2 | 1.2 | 1.1 | 1.0 |
| Max | 14.2 | 14.1 | 14.1 | 14.1 | 14.0 |
| Min | 11.8 | 10.8 | 9.4 | 7.4 | 5.2 |
| Range | 2.4 | 3.3 | 4.7 | 6.7 | 8.9 |
| WiW± | 9.2 | 13.2 | 19.9 | 30.1 | 45.8 |
| WiW1$\sigma$ | 6.3 | 9.0 | 13.3 | 20.2 | 30.8 |

SUBSTRATE PROCESSING APPARATUS

CROSS-REFERENCE TO RELATED APPLICATION

This application is based upon and claims the benefit of priority from Japanese Patent Application No. 2022-097025, filed on Jun. 16, 2022, the entire contents of which are incorporated herein by reference.

TECHNICAL FIELD

Various aspects and embodiments of the present disclosure relate to a substrate processing apparatus.

BACKGROUND

There is known a technique that supplies a gas containing two types of monomers into a processing container in which a substrate is accommodated, and forms an organic film of a polymer on the substrate by a polymerization reaction between the two types of monomers. For example, there is known a technique for forming an organic film of a polymer on a substrate by a vacuum deposition polymerization reaction between an aromatic alkyl, alicyclic or aliphatic diisocyanate monomer, and an aromatic alkyl, alicyclic or aliphatic diamine monomer (see, for example, Patent Document 1).

PRIOR ART DOCUMENT

Patent Document

Patent Document 1: International Publication No. WO2008/129925

SUMMARY

According to an embodiment of the present disclosure, there is provided a substrate processing apparatus, including: a processing container; a stage provided in an interior of the processing container to place a substrate on the stage; an exhaust space arranged around the stage along an inner wall of the processing container; a first exhaust path provided between a processing space above the stage and the exhaust space and having a smaller conductance than the processing space; and a second exhaust path provided between a lower space below the stage and the exhaust space and having a smaller conductance than the processing space, wherein a processing gas supplied into the processing space is exhausted via the first exhaust path, a purge gas supplied into the lower space is exhausted via the second exhaust path, and the second exhaust path is connected to the first exhaust path or to a space that is closer to the exhaust space than the first exhaust path.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a diagram showing an example of a film thickness distribution of an organic film when a flow rate of a purge gas is changed in the first embodiment.

DETAILED DESCRIPTION

Figure 1:
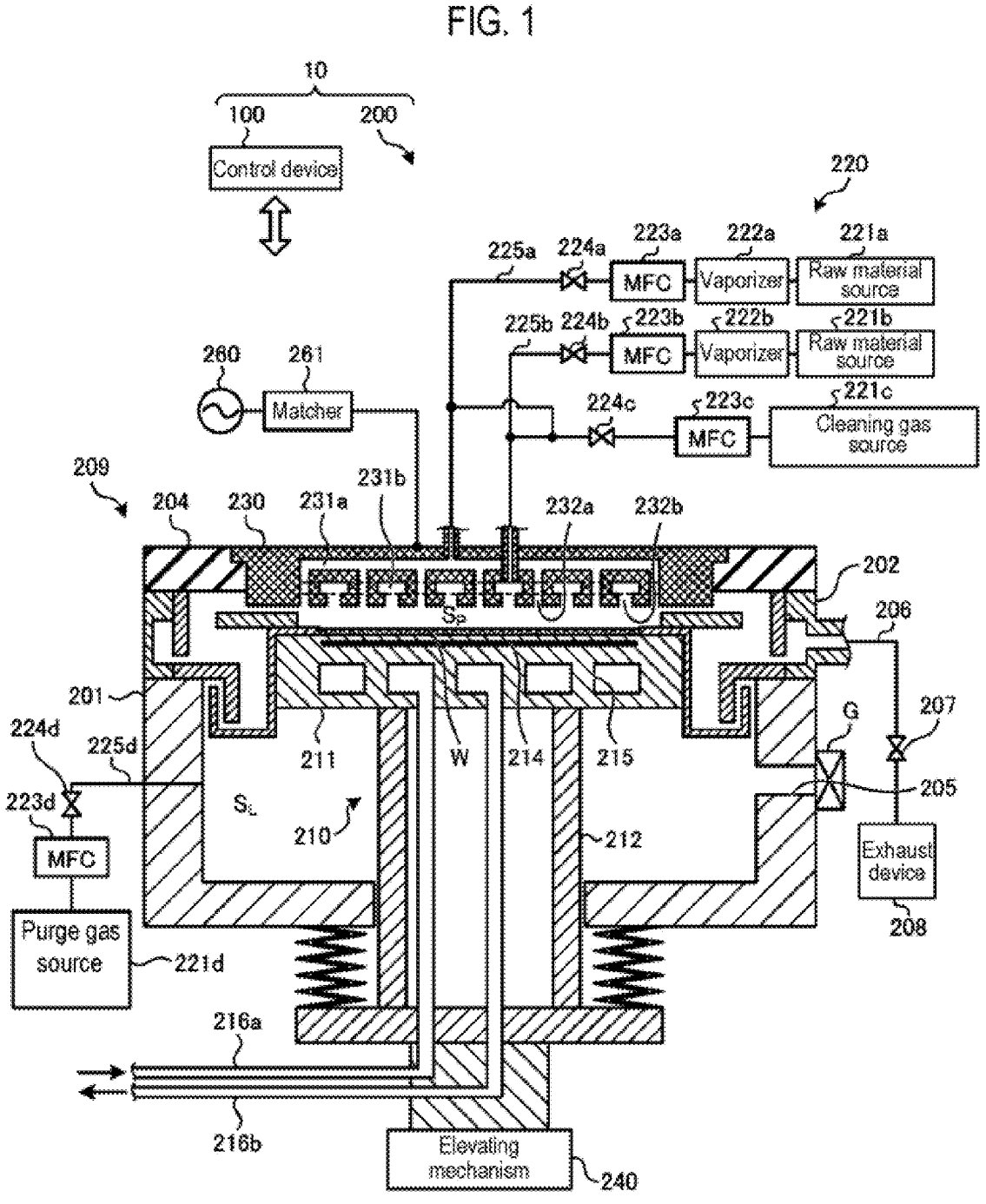
FIG. 1 is a schematic cross-sectional view showing an example of a substrate processing apparatus according to an embodiment of the present disclosure.

Embodiments of a substrate processing apparatus of the present disclosure will be described in detail below with reference to the drawings. It should be noted that the disclosed substrate processing apparatus is not limited to the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In vapor deposition polymerization of an organic film, a film-forming rate greatly changes depending on processing conditions. In particular, a concentration of a film-forming gas used for forming the organic film and a temperature of a place where a film is formed are important. For example, when the concentration of the film-forming gas is high and the temperature of the place where the film is formed is low, the film-forming rate becomes higher. When the concentration of the film-forming gas is low and the temperature of the place where the film is formed is high, the film-forming rate becomes lower. Therefore, in a space where a substrate in which a film is to be formed is arranged, the concentration of the film-forming gas needs to be kept high and the temperature of the substrate needs to be kept low.

Meanwhile, in a substrate processing apparatus for forming an organic film on a substrate, a film-forming gas that did not contribute to the formation of the organic film is exhausted. A portion of the film-forming gas that did not contribute to the formation of the organic film may diffuse inside a processing container of the substrate processing apparatus and may form an organic film on an inner wall and the like of the processing container. As a processing on a plurality of substrates progresses, the organic film formed on the inner wall and the like of the processing container may grow and may eventually become particles and adhere to the substrates. Therefore, a measure may be taken to suppress the formation of the organic film on the inner wall and the like of the processing container by heating the inner wall and the like of the processing container.

However, a certain portion inside the processing container may be less likely to be heated to a high temperature. For such a portion in the processing container, it is difficult to suppress the formation of the organic film. As a result, a film-forming process is frequently stopped to clean the interior of the processing container, which reduces throughput of the film-forming process. Thus, it is conceivable to suppress the formation of the organic film by supplying a purge gas to the certain portion inside the processing container, which is less likely to be heated, and diluting the film-forming gas supplied to the certain portion with the purge gas.

However, when the purge gas flows around the substrate, the concentration of the film-forming gas near the substrate decreases, which decreases the film-forming rate of the organic film on the substrate. As a result, the time required to form the organic film having a desired thickness on the substrate increases. This reduces the throughput of substrate processing such as film formation.

First Embodiment

[Configuration of Substrate Processing Apparatus 10]

FIG. 1 is a schematic cross-sectional view showing an example of a substrate processing apparatus 10 according to an embodiment of the present disclosure. The substrate processing apparatus 10 includes an apparatus body 200 and a control device 100 that controls the apparatus body 200. The apparatus body 200 includes a processing container 209. The processing container 209 includes a lower container 201, an exhaust duct 202, a support structure 210, and shower head 230.

The lower container 201 is made of a metal such as aluminum. The exhaust duct 202 is provided on an upper peripheral edge of the lower container 201. An annular insulating member 204 is arranged above the exhaust duct 202. The shower head 230 is provided above lower container 201 and is supported by the insulating member 204. The support structure 210 on which the substrate W is placed is provided substantially at the center of the lower container 201. A space between the support structure 210 and the shower head 230 is defined as a processing space $S_P$.

A sidewall of the lower container 201 is formed with an opening 205 for loading and unloading a substrate W therethrough. The opening 205 is opened and closed by a gate valve G. The exhaust duct 202 has a longitudinal cross-section of a hollow rectangular shape, and extends annularly along an upper portion of the lower container 201.

One end of an exhaust pipe 206 is connected to the exhaust duct 202. The other end of the exhaust pipe 206 is connected to an exhaust device 208 including a vacuum pump or the like via a pressure regulation valve 207 such as an APC (Auto Pressure Controller) valve. The pressure regulation valve 207 is controlled by the control device 100 to control an internal pressure of the processing space $S_P$ to a preset pressure.

A heater (not shown) is provided on the sidewall of the exhaust duct 202 and an upper surface of the shower head 230 to heat the exhaust duct 202 and the shower head 230 to a temperature of, for example, 200 degrees C. or higher. This suppresses reaction by-products (so-called deposits) from adhering to the exhaust duct 202 and the shower head 230 to some extent. The exhaust pipe 206, the pressure regulation valve 207, and the exhaust device 208 may also be provided with heaters and may be heated to a temperature at which deposits are less likely to adhere.

The support structure 210 includes a stage 211 and a support 212. The stage 211 is made of a metal such as aluminum, and the substrate W is placed on an upper surface of the stage 211. The shower head 230 is provided at a position facing the stage 211. The support 212 is made of a metal such as aluminum in a cylindrical shape, and supports the stage 211 from below.

A heater 214 is embedded in the stage 211. The heater 214 heats the substrate W placed on the stage 211 based on power supplied thereto. The power supplied to the heater 214 is controlled by the control device 100.

Further, a flow path 215 through which a coolant flows is formed inside the stage 211. A chiller unit (not shown) is connected to the flow path 215 via a pipe 216a and a pipe 216b. The coolant whose temperature is adjusted to a predetermined temperature by the chiller unit is supplied to the flow path 215 via the pipe 216a. The coolant flowing in the flow path 215 is returned to the chiller unit via the pipe 216b. The stage 211 is cooled down by the coolant circulating in the flow path 215. The chiller unit is controlled by the control device 100.

The support 212 is arranged inside the lower container 201 so as to pass through an opening formed at the bottom of the lower container 201. The support 212 is moved up and down with driving of an elevating mechanism 240. The elevating mechanism 240 is an example of a driver. When loading the substrate W, the support structure 210 is lowered with the driving of the elevating mechanism 240, and the gate valve G is open. Then, the substrate W is loaded into the lower container 201 by a transfer robot (not shown) via the opening 205 and delivered to lift pins (not shown) protruding above the stage 211. Then, the substrate W is placed on the stage 211 by lowering the lift pins (not shown). Then, the gate valve G is closed, the elevating mechanism 240 is driven to raise the support structure 210, and a film-forming process is performed on the substrate W. Further, when unloading the substrate W, the support structure 210 is lowered with the driving of the elevating mechanism 240, and the gate valve G is open. Then, the substrate W is lifted from the stage 211 by lifting the lift pins (not shown). Then, the substrate W on the lift pins (not shown) is transferred out of the lower container 201 via the opening 205 by the transfer robot (not shown).

The shower head 230 includes a diffusion chamber 231*a* and a diffusion chamber 231*b*. The diffusion chamber 231*a* and the diffusion chamber 231*b* are not in communication with each other. A gas supplier 220 is connected to the diffusion chambers 231*a* and 231*b*. Specifically, a valve 224*a*, an MFC (Mass Flow Controller) 223*a*, a vaporizer 222*a*, and a raw material source 221*a* are connected to the diffusion chamber 231*a* via a pipe 225*a*. The raw material source 221*a* is a source of isocyanate, which is an example of a first monomer. The vaporizer 222*a* vaporizes an iso-cyanate liquid supplied from the raw material source 221*a*. The MFC 223*a* controls a flow rate of an isocyanate vapor vaporized by the vaporizer 222*a*. The valve 224*a* controls the supply and cutoff of the isocyanate vapor to the pipe 225*a*.

A valve 224*b*, an MFC 223*b*, a vaporizer 222*b*, and a raw material source 221*b* are connected to the diffusion chamber 231*b* via a pipe 225*b*. The raw material source 221*b* is a source of amine, which is an example of a second monomer. The vaporizer 222*b* vaporizes an amine liquid supplied from the raw material source 221*b*. The MFC 223*b* controls a flow rate of an amine vapor vaporized by the vaporizer 222*b*. The valve 224*b* controls the supply and cutoff of the amine vapor to the pipe 225*b*. The isocyanate vapor and the amine vapor are examples of film-forming gases. Further, the isocyanate vapor is an example of a first process gas, and the amine vapor is an example of a second process gas.

A valve 224*c*, an MFC 223*c*, and a cleaning gas source 221*c* are connected to the shower head 230 via the pipe 225*a* and the pipe 225*b*. The cleaning gas source 221*c* is a source of a cleaning gas containing molecules including, for example, oxygen atoms or fluorine atoms. The MFC 223*c* controls a flow rate of the cleaning gas supplied from the cleaning gas source 221*c*. The valve 224*c* controls the supply and cutoff of the cleaning gas to the pipes 225*a* and 225*b*.

The diffusion chamber 231*a* communicates with the pro-cessing space $S_P$ via a plurality of discharge ports 232*a*, and the diffusion chamber 231*b* communicates with the process-ing space $S_P$ via a plurality of discharge ports 232*b*. The gas supplied into the diffusion chamber 231*a* via the pipe 225*a* is diffused inside the diffusion chamber 231*a* and discharged into the processing space $S_P$ via the discharge ports 232*a* in the form of a shower. Further, the gas supplied into the diffusion chamber 231*b* through the pipe 225*b* is diffused inside the diffusion chamber 231*b* and discharged into the processing space $S_P$ through the discharge ports 232*b* in the form of a shower. The isocyanate vapor and the amine vapor are discharged into the processing space $S_P$ through the discharge ports 232*a* and the discharge ports 232*b*, and are mixed with each other inside the processing space $S_P$ to form an organic film of a polymer having urea bonds on the surface of the substrate W placed on the stage 211.

For example, by using a diisocyanate as the first monomer and a diamine (e.g., primary amine) as the second monomer, linear polyurea may be produced. The combination of dii-socyanate and diamine is, for example, a combination of 4,4'-diphenylmethane diisocyanate (MDI) and 1,12-di-aminododecane (DAD). The combination of diisocyanate and diamine is, for example, a combination of 1,3-bis (isocyanatomethyl)cyclohexane (H6XDI) and 1,12-di-aminododecane (DAD). The combination of diisocyanate and diamine is, for example, a combination of 1,3-bis (isocyanatomethyl)cyclohexane (H6XDI) and 1,3-bis(aminomethyl)cyclohexane (H6XDA). The combination of dii-socyanate and diamine is, for example, a combination of 1,3-bis(isocyanatomethyl)cyclohexane (H6XDI) and hex-amethylenediamine (HMDA). The combination of diisocya-nate and diamine is, for example, a combination of m-xy-lylene diisocyanate (XDI) and m-xylylene diamine (XDA). The combination of diisocyanate and diamine is, for example, a combination of m-xylylene diisocyanate (XDI) and benzylamine (BA).

For example, by using diisocyanate as the first monomer and triamine (e.g., primary amine) or tetraamine (e.g., secondary amine) as the second monomer, cross-linkable polyurea may be produced. Further, by using a monoiso-cyanate as the first monomer and a diamine (e.g., primary amine) as the second monomer, trimers having urea bonds may be produced. Further, by using monoisocyanate as the first monomer and monoamine (e.g., primary amine) as the second monomer, dimers having urea bonds may be pro-duced.

An RF power supply 260 that supplies RF (Radio Fre-quency) power for plasma generation is connected to the shower head 230 via a matcher 261. The shower head 230 functions as a cathode electrode for the stage 211. When cleaning the interior of the processing container 209, a cleaning gas is supplied from the gas supplier 220 into the processing space $S_P$ through the shower head 230, and the RF power is supplied into the processing space $S_P$ from the RF power supply 260 via the matcher 261. As a result, the cleaning gas is plasmarized inside the processing space $S_P$, and the interior of the processing container 209 is cleaned by active species contained in the plasma.

A valve 224*d*, an MFC 223*d*, and a purge gas source 221*d* are connected to the lower container 201 below the stage 211 via a pipe 225*d*. The purge gas source 221*d* is a source of a purge gas. The purge gas is, for example, an inert gas such as a nitrogen gas or a noble gas. The MFC 223*d* controls a flow rate of the purge gas supplied from the purge gas source 221*d*. The valve 224*d* controls the supply and cutoff of the purge gas to the pipe 225*d*. An internal space of the lower container 201 below the stage 211 is defined as a lower space $S_L$. By supplying the purge gas into the lower space $S_L$, it is possible to prevent the film-forming gas supplied into the processing space $S_P$ from entering the lower space $S_L$.

The control device 100 includes a memory, a processor, and an input/output interface. The memory stores control programs, processing recipes, and the like. The processor reads out a control program from the memory and executes the same to control each part of the apparatus body 200 via the input/output interface based on the recipe stored in the memory.

[Structure Near Peripheral Edge of Stage 211]

Figures 2, 3:
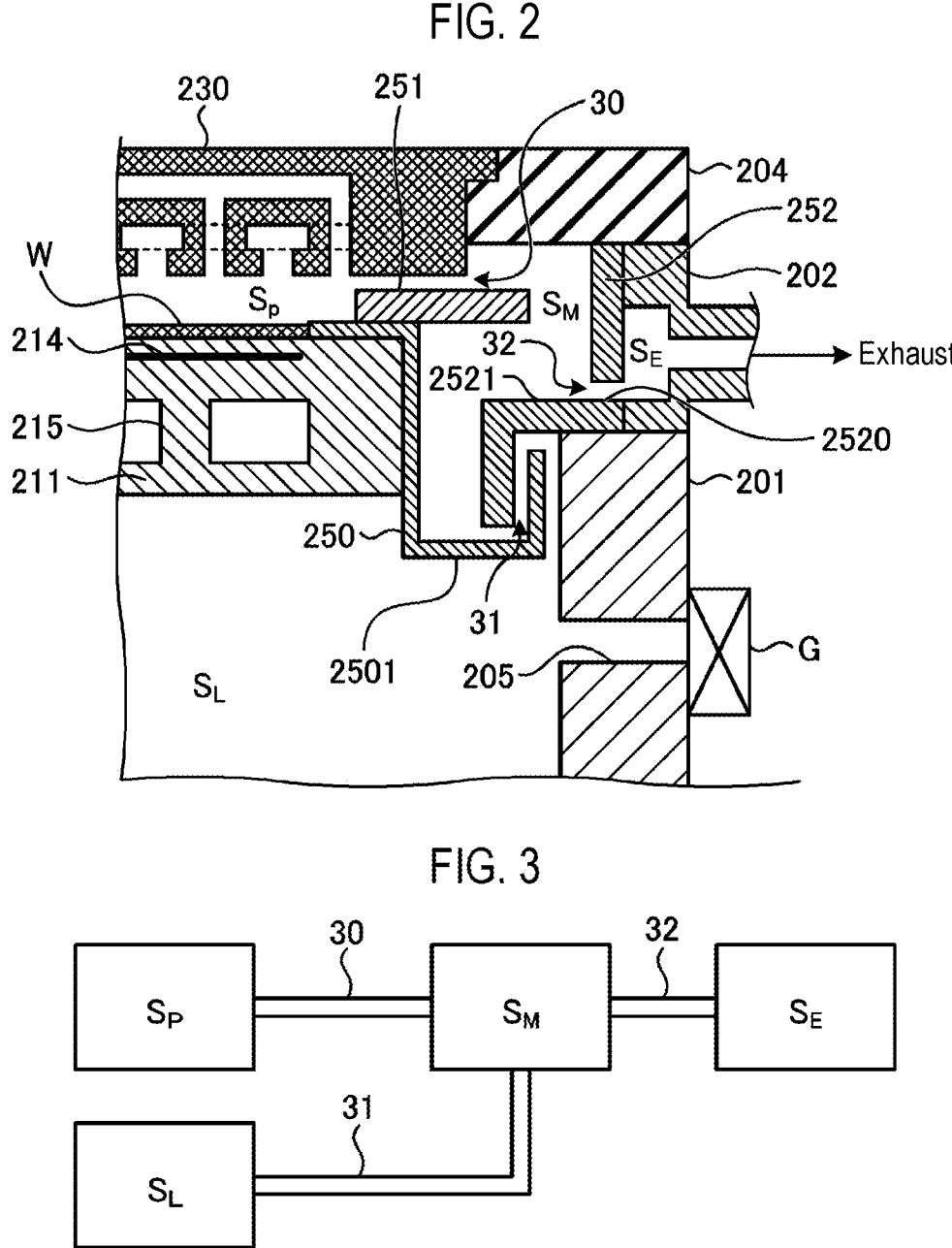
FIG. 2 is an enlarged cross-sectional view showing an example of a structure near a peripheral edge of a stage in a first embodiment.
FIG. 3 is a diagram for explaining an example of a relationship between conductances of respective spaces in the first embodiment.

FIG. 2 is an enlarged cross-sectional view showing an example of a structure near a peripheral edge of the stage 211 in the first embodiment. An annular stage cover 250 is provided around the peripheral edge of the upper surface of the stage 211 on which the substrate W is placed, so as to surround the peripheral edge of the upper surface of the stage 211. In the present embodiment, for example, as shown in FIG. 2, the stage cover 250 is provided with an annular exhaust blade 2501 that has a cross section extending away from a lateral surface of the stage 211 and protruding upward along the sidewall of the lower container 201. The exhaust blade 2501 is annularly formed along an outer periphery of the stage 211. The exhaust blade 2501 is an example of a first exhaust blade. A gap is provided between the exhaust blade 2501 and the sidewall of the lower container 201.

An annular plate-shaped ring cover 251 is arranged on the stage cover 250. A space between the lower surface of the shower head 230 and an upper surface of the ring cover 251 is defined as a first exhaust path 30.

A duct cover 252 is provided on the exhaust duct 202 along the extension direction of the exhaust duct 202. A slit-shaped exhaust port 2520 is formed in the duct cover 252 along the extension direction of the exhaust duct 202. For example, as shown in FIG. 2, the duct cover 252 is provided with an annular exhaust blade 2521 that has a cross section extending away from the sidewall of the lower container 201 and hanging downward along the sidewall of the lower container 201. The exhaust blade 2521 is annularly formed along the sidewall of the lower container 201. The exhaust blade 2521 is an example of a second exhaust blade. When forming an organic film on the substrate W, for example, as shown in FIG. 2, the exhaust blade 2501 of the stage cover 250 is arranged between the exhaust blade 2521 of the duct cover 252 and the sidewall of the lower container 201. Gaps are provided between the exhaust blade 2521 and the exhaust blade 2501 and between the exhaust blade 2521 and the sidewall of the lower container 201.

A space between the lower container 201 and the exhaust blade 2501 and a space between the exhaust blade 2521 and the exhaust blade 2501 are defined as a second exhaust path 31. Further, a space inside the exhaust port 2520 is defined as a third exhaust path 32, and a space surrounded by the duct cover 252 and the exhaust duct 202 is defined as an exhaust space $S_E$. A space between the first exhaust path 30, the second exhaust path 31, and the third exhaust path 32 is defined as an intermediate space $S_M$.

In the process of forming the organic film on the substrate W, the gas supplied into the processing space $S_P$ is exhausted to the exhaust space $S_E$ via the first exhaust path 30, the intermediate space $S_M$, and the third exhaust path 32. Further, the purge gas supplied to the lower space $S_L$ is exhausted to the exhaust space $S_E$ via the second exhaust path 31, the intermediate space $S_M$, and the third exhaust path 32.

Further, a distance between the lower surface of the shower head 230 and the upper surface of the ring cover 251 is much shorter than a distance between the lower surface of the shower head 230 and the upper surface of the substrate W placed on the stage 211. As a result, a conductance of the first exhaust path 30 is smaller than that of the processing space $S_P$. Moreover, in the present embodiment, a conductance of the second exhaust path 31 is also smaller than that of the processing space $S_P$.

A relationship between the conductances of these spaces is, for example, as shown in FIG. 3. FIG. 3 is a diagram for explaining an example of the relationship between the conductances of the respective spaces in the first embodiment. In the example of FIG. 3, the thickness of each part represents the magnitude of conductance. For example, as shown in FIG. 3, the processing space $S_P$ and the intermediate space $S_M$ communicate with each other via the first exhaust path 30 having a smaller conductance than the processing space $S_P$. The lower space $S_L$ and the intermediate space $S_M$ communicate with each other via the second exhaust path 31 having a smaller conductance than the processing space $S_P$. In addition, the intermediate space $S_M$ and the exhaust space $S_E$ communicate with each other via the third exhaust path 32 having a smaller conductance than the processing space $S_P$.

Figure 4:
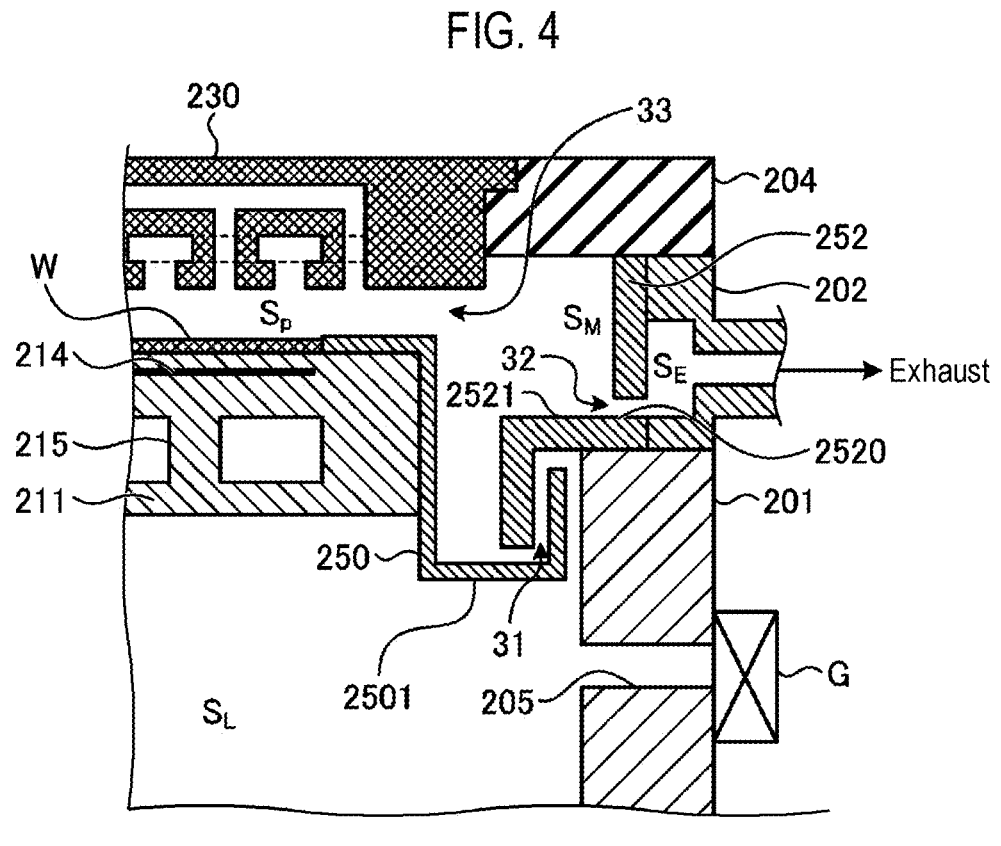
FIG. 4 is an enlarged cross-sectional view showing an example of a structure near a peripheral edge of a stage in Comparative Example.

Now, a case in which the structure near the peripheral edge of the stage 211 is, for example, a structure shown in FIG. 4, is considered. FIG. 4 is an enlarged cross-sectional view showing an example of a structure near a peripheral edge of the stage 211 in Comparative Example. In the Comparative Example shown in FIG. 4, the ring cover 251 is not provided. Thus, in the Comparative Example, the conductance of the processing space $S_P$ and the conductance of the exhaust path 33 between the lower surface of the shower head 230 and the upper surface of the stage cover 250 are substantially the same.

Figure 5:
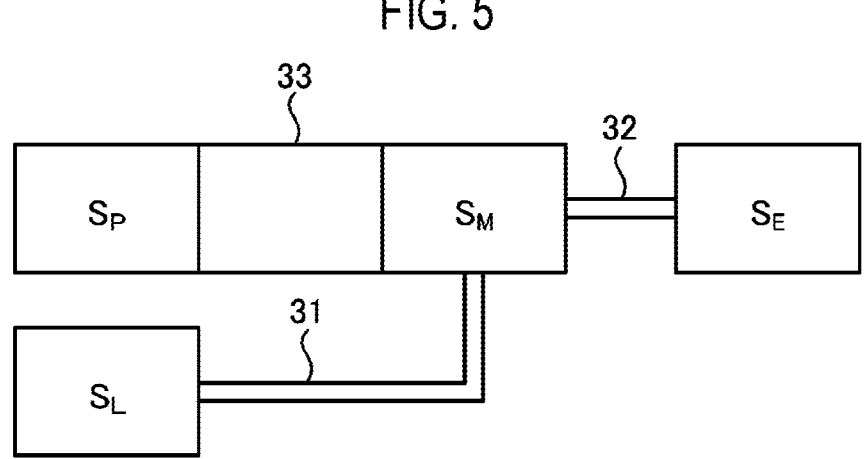
FIG. 5 is a diagram for explaining an example of a relationship between conductances of respective spaces in the Comparative Example.

A relationship between the conductances of the respective spaces in the Comparative Example is, for example, as shown in FIG. 5. FIG. 5 is a diagram for explaining an example of the relationship between the conductances of the respective spaces in the Comparative Example. In the Comparative Example, the ring cover 251 is not provided. Thus, in the Comparative Example, when a film-forming process is performed, a large amount of film-forming gas flows into the intermediate space $S_M$ from the processing space $S_P$ via the exhaust path 33. As a result, a partial pressure of the film-forming gas inside the intermediate space $S_M$ increases. Therefore, a film forming gas having a high concentration flows into the intermediate space $S_M$, the third exhaust path 32, and the exhaust space $S_E$, so that an organic film is likely to be formed as a deposit on the sidewalls of the intermediate space $S_M$, the third exhaust path 32, and the exhaust space $S_E$. In a case in which there is a portion in the sidewalls of the intermediate space $S_M$, the third exhaust path 32, and the exhaust space $S_E$, which is less likely to be sufficiently heated to the extent that the formation of the organic film is inhibited, it is necessary to stop the film-forming process and frequently clean the portion.

Further, in the Comparative Example, increasing the flow rate of the purge gas to be supplied to the lower space $S_L$ to lower the partial pressure of the film-forming gas inside the intermediate space $S_M$ is considered. As a result, the amount of purge gas supplied into the intermediate space $S_M$ is increased, which makes it possible to lower the partial pressure of the film-forming gas inside the intermediate space $S_M$. However, in the Comparative Example, since the conductance of the exhaust path 33 is large, the purge gas supplied into the intermediate space $S_M$ easily flows into the processing space $S_P$ via the exhaust path 33. When the purge gas flows into the processing space $S_P$, the concentration of the film-forming gas in the processing space $S_P$ decreases. When the concentration of the film-forming gas in the processing space $S_P$ decreases, the film-forming rate decreases and the throughput in the film-forming process decreases.

On the other hand, in the present embodiment, for example, as shown in FIG. 3, the processing space $S_P$ and the intermediate space $S_M$ communicate with each other via the first exhaust path 30 having a low conductance. This makes it possible to suppress the amount of the purge gas, which is supplied into the lower space $S_L$ and flows from the intermediate space $S_M$ into the processing space $S_P$ via the first exhaust path 30, at a low level. Accordingly, even if the flow rate of the purge gas supplied to the lower space $S_L$ is increased, the flow rate of the purge gas flowing into the processing space $S_P$ can be suppressed at a low level, which makes it possible to suppress the reduction in the film-forming rate of the organic film.

In addition, since the flow rate of the purge gas supplied to the lower space $S_L$ may be increased while suppressing the reduction in the film-forming rate of the organic film, it is possible to reduce the partial pressure of the film-forming gas inside the intermediate space $S_M$. As a result, the concentration of the film-forming gas flowing in the intermediate space $S_M$, the third exhaust path 32, and the exhaust space $S_E$ is lowered, which makes it possible to suppress the adhesion of the organic film to the sidewalls of the intermediate space $S_M$, the third exhaust path 32, and the exhaust space $S_E$. Thus, the frequency of cleaning may be reduced, and the throughput in the film-forming process may be improved.

[Experimental Result]

FIG. 6 is a diagram showing an example of a film thickness distribution of the organic film when the flow rate of the purge gas is changed in the first embodiment. In FIG. 6, "Average" denotes the average film thickness of the organic films formed on the substrate W, "D/R" denotes the film-forming rate, "Max" denotes the maximum value of the film thickness, "Min" denotes the minimum value of the film thickness, and "Range" denotes the difference between the maximum and minimum values of the film thickness. "WiW±" denotes the value obtained by dividing the percentage of Range to the average film thickness by half, and "WiW1σ" denotes the percentage of the standard deviation to the average film thickness. For example, as shown in FIG. 6, when the flow rate of the purge gas is increased to 1,600 sccm, the film-forming rate (D/R) is slightly changed. However, the reduction in the film-forming rate when the flow rate of the purge gas is 1,600 sccm is suppressed to 30% or lower of the film-forming rate when the flow rate of the purge gas is 100 sccm.

When the flow rate of the purge gas is 100 sccm, the partial pressure of the film-forming gas in the exhaust space $S_E$ was 250 mTorr, and when the flow rate of the purge gas is 1,600 sccm, the partial pressure of the film-forming gas in the exhaust space $S_E$ was 50 mTorr. That is, when the flow rate of the purge gas is increased to 1,600 sccm, the partial pressure of the film-forming gas in the exhaust space $S_E$ could be reduced to 20% or less as compared with the case where the flow rate of the purge gas is 100 sccm. This makes it possible to suppress the formation of an organic film in the exhaust space $S_E$, thus significantly reducing the frequency of cleaning.

[Operation During Cleaning]

Figure 7:
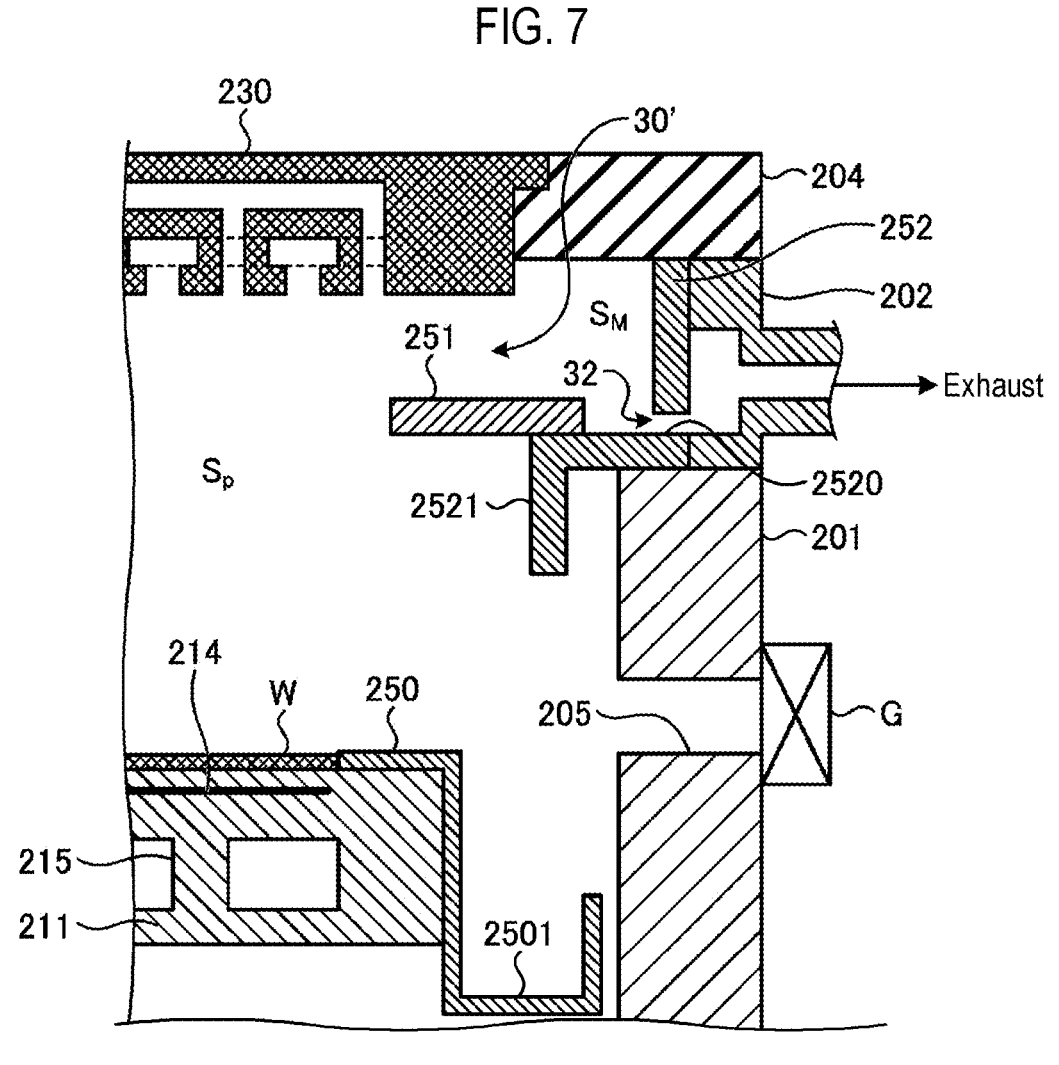
FIG. 7 is an enlarged cross-sectional view showing an example of a state near the peripheral edge of the stage during cleaning in the first embodiment.

FIG. 7 is an enlarged cross-sectional view showing an example of a state near the peripheral edge of the stage 211 during cleaning in the first embodiment. In order to suppress the adhesion of the organic film to portions other than the substrate W during the film-forming process, the portions other than the substrate W are heated, or the film-forming gas supplied to the portions other than the substrate W is diluted. However, it is difficult to completely prevent the adhesion of the organic film to the portions other than the substrate W. Therefore, as the film-forming process is repeated, the organic film may adhere to the portions other than the substrate W. Thus, the interior of the processing container 209 is cleaned before the organic film adhering to the portions other than the substrate W becomes particles and scatters within the processing container 209.

In the present embodiment, the cleaning inside the processing container 209 is performed in a state in which the stage 211 is moved down by driving the elevating mechanism 240. As the stage 211 is moved down from a position where the film-forming process is performed, the ring cover 251 descends together with the stage 211. For example, as shown in FIG. 7, the ring cover 251 is delivered from the upper surface of the stage cover 250 to the upper surface of the exhaust blade 2521. As a result, the space between the lower surface of the shower head 230 and the upper surface of the ring cover 251 expands to a first exhaust path 30', thereby increasing a conductance of the first exhaust path 30'. Thus, active species of the cleaning gas plasmarized inside the processing space $S_P$ are easily diffused into the intermediate space $S_M$ via the first exhaust path 30'. Accordingly, the organic film adhering to the wall surface of the intermediate space $S_M$ can be efficiently removed.

Further, as the stage 211 descends and the ring cover 251 is delivered from the upper surface of the stage cover 250 to the upper surface of the exhaust blade 2521, for example, as shown in FIG. 7, the lower surface of the ring cover 251 and the upper surface of the stage cover 250 are moved away from each other. As a result, the organic film adhering to the lower surface of the ring cover 251 and the organic film adhering to the upper surface of the stage cover 250 may be efficiently removed by the active species of the cleaning gas plasmarized inside the processing space $S_P$.

The first embodiment has been described above. As described above, the substrate processing apparatus 10 according to the present embodiment includes the processing container 209, the stage 211, the exhaust space $S_E$, the first exhaust path 30, and the second exhaust path 31. The stage 211 is provided inside the processing container 209, and the substrate W is placed on the stage 211. The exhaust space $S_E$ is arranged around the stage 211 along the inner wall of the processing container 209. The first exhaust path 30 is provided between the processing space $S_P$ above the stage 211 and the exhaust space $S_E$, and has a smaller conductance than the processing space $S_P$. The second exhaust path 31 is provided between the lower space $S_L$ below the stage 211 and the exhaust space $S_E$, and has a smaller conductance than the processing space $S_P$. The processing gas supplied into the processing space $S_P$ is exhausted via the first exhaust path 30, and the purge gas supplied into the lower space $S_L$ is exhausted via the second exhaust path 31. Further, the second exhaust path 31 is connected to a space that is closer to the exhaust space $S_E$ than the first exhaust path 30. This makes it possible to suppress the flow rate of the purge gas flowing into the processing space $S_P$ at a low level, which suppresses the reduction in the film-forming rate of the organic film. Accordingly, it is possible to improve the throughput in the film-forming process.

In the above-described embodiment, the first exhaust path 30 corresponds the space between the ring cover 251 arranged on the annular stage cover 250 provided on the peripheral edge of the upper surface of the stage 211 and the lower surface of the shower head 230 arranged above the stage 211 to supply gases into the processing container 209. Further, the second exhaust path 31 corresponds to the space between the annular exhaust blade 2501 provided on the stage cover 250 and the annular exhaust blade 2521 provided on the sidewall of the processing container 209. Accordingly, it is possible to easily form the first exhaust path 30 and the second exhaust path 31.

Further, in the above-described embodiment, the substrate processing apparatus 10 includes the elevating mechanism 240 configured to move the stage 211 up and down. The valve 2240 raises the conductance of the first exhaust path 30 by moving down the stage 211 when the interior of the processing container 209 is cleaned. Further, the ring cover 251 is delivered from the stage cover 250 to the exhaust blade 2521 as the stage 211 moves down. Accordingly, it is possible to efficiently remove the organic film adhering to the lower surface of the ring cover 251 and the organic film adhering to the upper surface of the stage cover 250.

Moreover, in the above-described embodiment, the shower head 230 supplies the first processing gas containing the first monomer and the second processing gas containing the second monomer from the respective discharge ports 232a and 232b into the processing container 209 to form a film of a polymer which is the first monomer and the second monomer on the substrate W placed on the stage 211. Further, the first monomer is, for example, isocyanate, the second monomer is, for example, amine. The polymer formed on the substrate W contains urea bonds. The thickness of the film of the polymer formed on the substrate W is affected by the concentrations of the first monomer gas and the second monomer gas on the substrate W. In the present embodiment, it is possible to suppress the reduction in the concentrations of the first monomer gas and the second monomer gas inside the processing space $S_P$. Therefore, it is possible to suppress the reduction in the film-forming rate of the polymer film formed on the substrate W.

Second Embodiment

In the first embodiment, the processing space $S_P$ communicates with the intermediate space $S_M$ via the first exhaust path 30, the lower space $S_L$ communicates with the intermediate space $S_M$ via the second exhaust path 31, and the intermediate space $S_M$ communicates with the exhaust space $S_E$ via the third exhaust path 32. On the other hand, a second embodiment differs from the first embodiment in that the processing space $S_P$ communicates with the exhaust space $S_E$ via the first exhaust path 30, and the lower space $S_L$ communicates with the exhaust space $S_E$ via the second exhaust path 31. Next, differences between the first and second embodiments will be mainly described.

Figure 8:
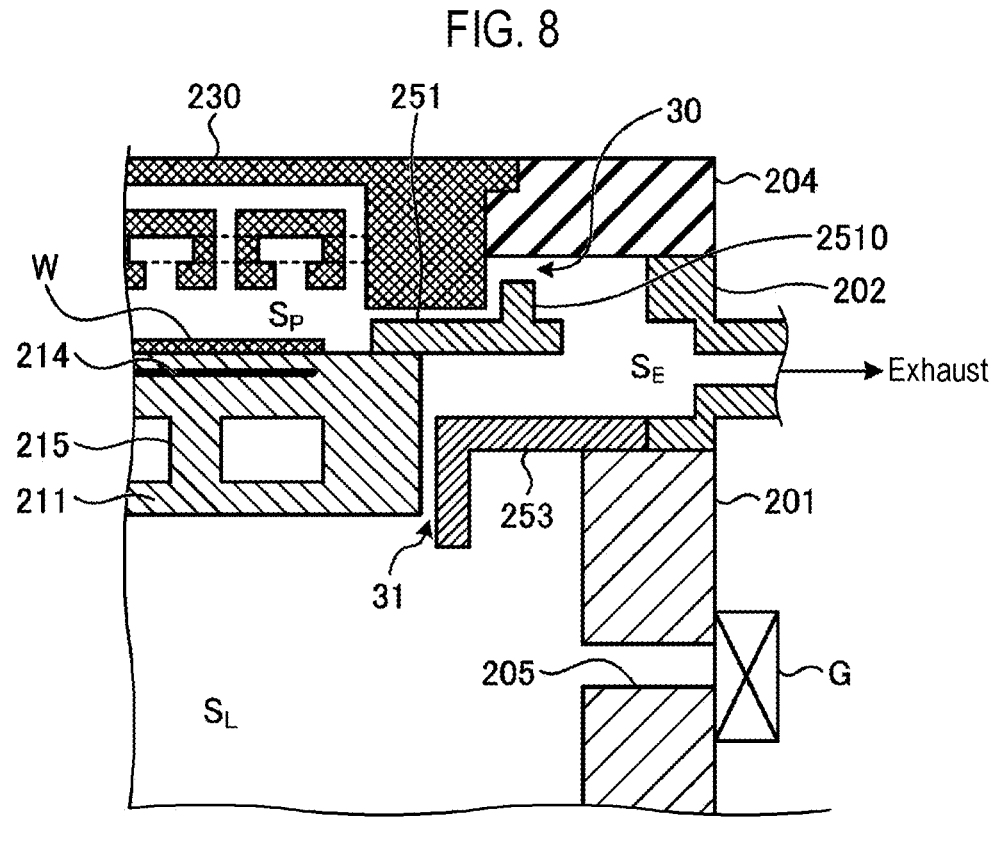
FIG. 8 is an enlarged cross-sectional view showing an example of a structure near a peripheral edge of a stage in a second embodiment.

FIG. 8 is an enlarged cross-sectional view showing an example of a structure near the peripheral edge of the stage 211 in the second embodiment. In the present embodiment, the ring cover 251 is arranged on the peripheral edge of the upper surface of the stage 211 instead of arranging the stage cover 250 on the peripheral edge of the upper surface of the stage 211. The ring cover 251 in the present embodiment includes an annular projection 2510 formed to stand in a direction intersecting with the upper surface of the stage 211. In the present embodiment, a space between the lower surface of the shower head 230 and an upper surface of the ring cover 251 and the space between the lateral surface of the shower head 230 and a lateral surface of the projection 2510 are defined as the first exhaust path 30.

The conductance of the first exhaust path 30 is smaller than the conductance of the processing space $S_P$. In the example of FIG. 8, the ring cover 251 is formed with the projection 2510. However, just like the ring cover 251 in the first embodiment, the ring cover 251 may not be provided with the projection 2510. Even in this case, the conductance of the first exhaust path 30 may be made smaller than the conductance of the processing space $S_P$.

Further, in the example of FIG. 8, the stage cover 250 is not arranged on the peripheral edge of the upper surface of the stage 211, and the ring cover 251 is arranged on the peripheral edge of the upper surface of the stage 211. However, the disclosed technique is limited thereto. Also in the present embodiment, the stage cover 250 without the exhaust blade 2501 may be arranged on the peripheral edge of the upper surface of the stage 211, and the ring cover 251 may be arranged on the stage cover 250.

Further, in the present embodiment, an annular exhaust blade 253 is provided along the exhaust duct 202. For example, as shown in FIG. 8, the exhaust blade 253 has a cross-sectional shape that extends away from the sidewall of the lower container 201 and hangs downward along the sidewall of the lower container 201. In the present embodiment, a space between the lateral surface of the stage 211 and a lateral surface of the exhaust blade 253 is defined as the second exhaust path 31. In the present embodiment, the exhaust duct 202 is not provided with the duct cover 252. Further, the exhaust blade 253 does not need to have a portion that hangs downward along the sidewall of the lower container 201 as long as it has a cross-section shape extending away from the lower container 201. The exhaust blade 253 is an example of the second exhaust blade.

Figure 9:
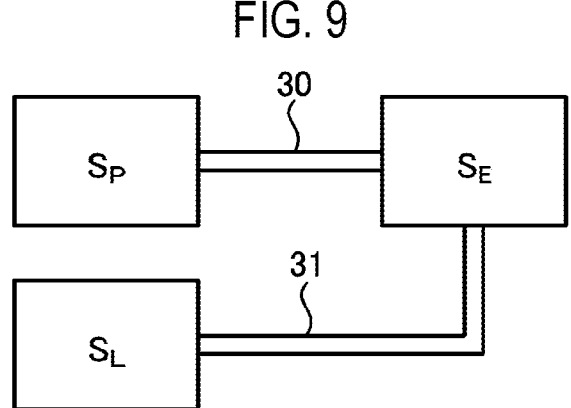
FIG. 9 is a diagram for explaining an example of a relationship between conductances of respective spaces in the second embodiment.

A relationship between the conductances of the processing space $S_P$, the lower space $S_L$, the exhaust space $S_E$, the first exhaust path 30 and the second exhaust path 31 is, for example, as shown in FIG. 9. FIG. 9 is a diagram for explaining an example of the relationship between the conductances of the respective spaces in the second embodiment. In the example of FIG. 9, the thickness of each part represents the magnitude of conductance. In the process of forming an organic film on the substrate W, the film-forming gas supplied into the processing space $S_P$ is exhausted to the exhaust space $S_E$ via the first exhaust path 30, and the purge gas supplied to the lower space $S_L$ is exhausted to the exhaust space $S_E$ via the second exhaust path 31.

In the present embodiment, for example, as shown in FIG. 9, the processing space $S_P$ and the exhaust space $S_E$ communicate with each other via the first exhaust path 30 having a low conductance. Therefore, the amount of the purge gas supplied to the lower space $S_L$ and flowing into the processing space $S_P$ from the exhaust space $S_E$ via the first exhaust path 30 may be suppressed at a low level. Accordingly, even if the flow rate of the purge gas supplied to the lower space $S_L$ is increased, the flow rate of the purge gas flowing into the processing space $S_P$ can be suppressed at a low level, which makes it possible to suppress the reduction in the film-forming rate of the organic film.

In addition, since the flow rate of the purge gas supplied to the lower space $S_L$ can be increased while suppressing the reduction in the film-forming rate of the organic film, it is possible to reduce the partial pressure of the film-forming gas inside the exhaust space $S_E$. This makes it possible to reduce the concentration of the film-forming gas flowing in the exhaust space $S_E$, thus suppressing the adhesion of the organic film to the sidewalls of the exhaust space $S_E$. Accordingly, the frequency of cleaning can be reduced, and the throughput in the film-forming process can be improved.
[Operation During Cleaning]

Figure 10:
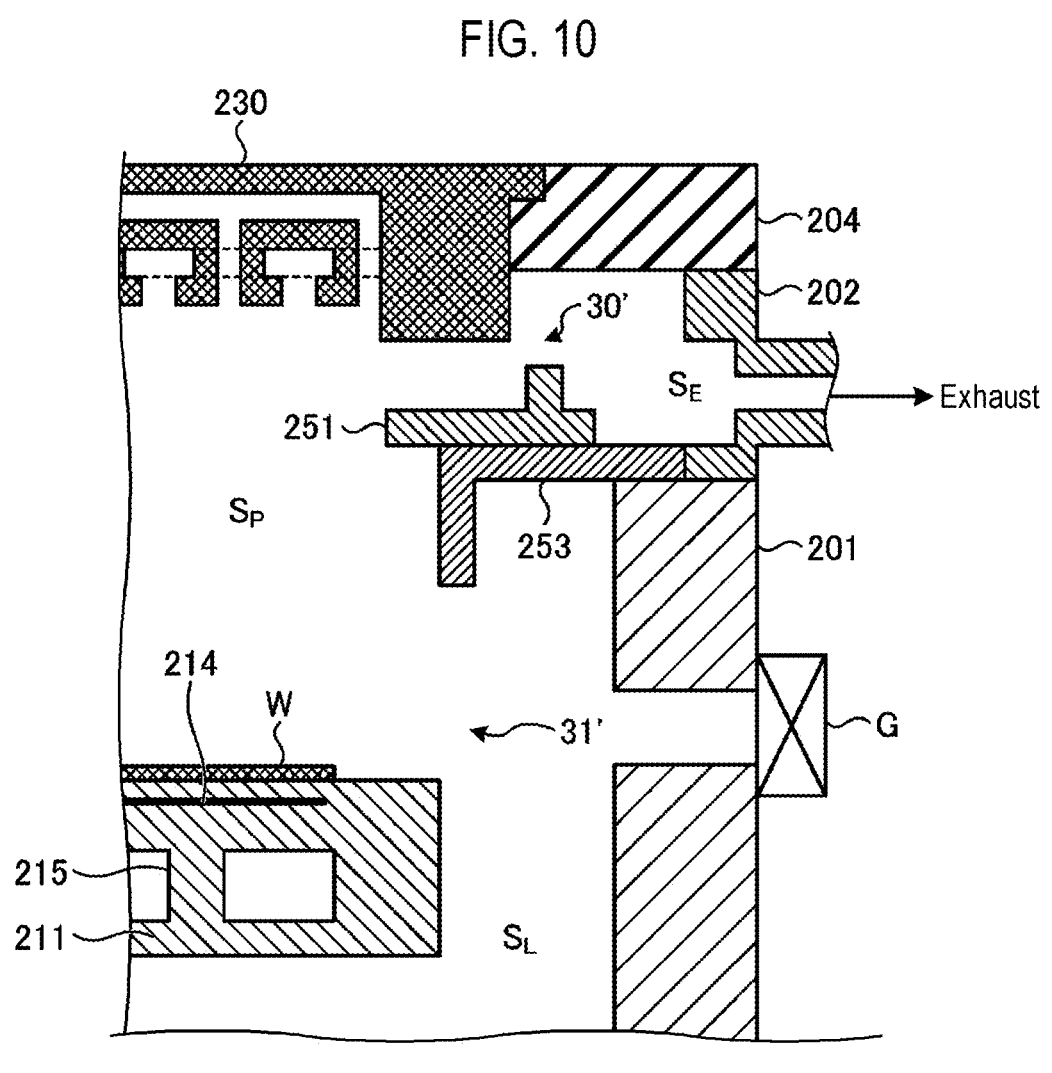
FIG. 10 is an enlarged cross-sectional view showing an example of a state near the peripheral edge of the stage during cleaning in the second embodiment.

FIG. 10 is an enlarged cross-sectional view showing an example of the state near the peripheral edge of the stage 211 during cleaning in the second embodiment. In the present embodiment, the cleaning inside the processing container 209 is performed in a state in which the stage 211 is moved down by driving the elevating mechanism 240. As the stage 211 is moved down from the position where the film-forming process is performed, the ring cover 251 is moved down together with the stage 211. For example, as shown in FIG. 10, the ring cover 251 is delivered from the upper surface of the stage 211 to the upper surface of the exhaust blade 253. As a result, the space between the lower surface of the shower head 230 and the upper surface of the ring cover 251 and the space between the lateral surface of the shower head 230 and the lateral surface of the projection 2510 expand to the first exhaust path 30'. Thus, the conductance of the first exhaust path 30' is increased, and the active species of the cleaning gas plasmarized inside the processing space $S_P$ are easily diffused into the exhaust space $S_E$ via the first exhaust path 30'. Accordingly, it is possible to efficiently remove the organic film adhering to the wall surface and the like of the exhaust space $S_E$.

Further, when the stage 211 is moved down and the ring cover 251 is delivered from the upper surface of the stage 211 to the upper surface of the exhaust blade 253, for example, as shown in FIG. 10, the lower surface of the ring cover 251 and the upper surface of the stage 211 are moved away from each other. As a result, the organic film adhering to the lower surface of the ring cover 251 and the organic film adhering to the upper surface of the stage 211 can be efficiently removed by the active species of the cleaning gas plasmarized inside the processing space $S_P$.

Further, the stage 211 and the exhaust blade 253 are moved away from each other by lowering the stage 211, and the space between the stage 211 and the exhaust blade 253 expands to the second exhaust path 31'. As a result, the conductance of the second exhaust path 31' is increased, and the active species of the cleaning gas plasmarized inside the processing space $S_P$ are easily diffused into the lower space $S_L$ via the second exhaust path 31'. Accordingly, it is possible to efficiently remove the organic film adhering to the wall surface and the like of the lower space $S_L$.

Figure 11:
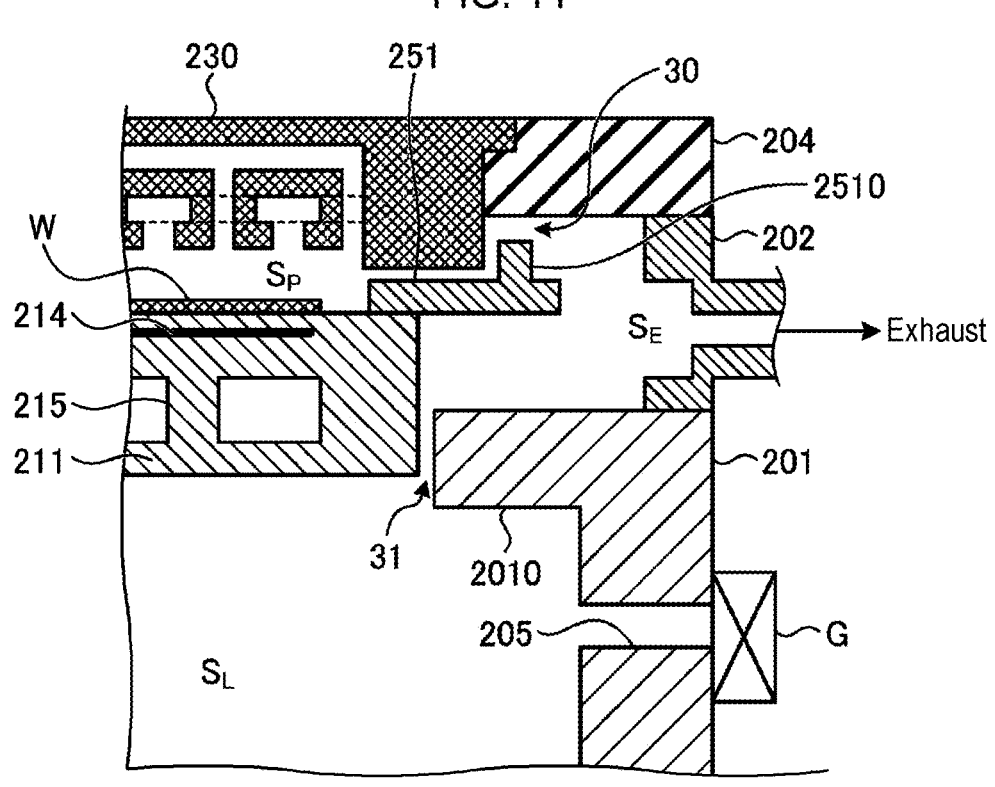
FIG. 11 is an enlarged cross-sectional view showing another example of the structure near the peripheral edge of the stage in the second embodiment.

In addition, in the example of FIG. 8, the annular exhaust blade 253 is provided along the exhaust duct 202. However, the disclosed technique is not limited thereto. In the lower container 201, for example, as shown in FIG. 11, an annular shelf portion 2010 protruding toward the lower space $S_L$ may be formed along the sidewall of the lower container 201 below the exhaust duct 202. In this case, a space between a sidewall of the shelf portion 2010 and the sidewall of the stage 211 corresponds to the second exhaust path 31.

The second embodiment has been described above. As described above, the substrate processing apparatus 10 according to the present embodiment further includes an annular ring cover 251 arranged on the peripheral edge of the upper surface of the stage 211 and having the annular projection 2510 formed to stand in the direction intersecting with the upper surface of the stage 211. The first exhaust path 30 corresponds to at least one of the space between the upper surface of the ring cover 251 and the lower surface of the shower head 230 located above the stage 211, and the space between the lateral surface of the projection 2510 of the ring cover 251 and the lateral surface of the shower head 230. The second exhaust path 31 corresponds to the space between the lateral surface of the stage 211 and the annular exhaust blade 253 provided on the sidewall of the lower container 201. Accordingly, it is possible to easily form the first exhaust path 30 and the second exhaust path 31.

Further, in the above-described embodiment, the substrate processing apparatus 10 includes the elevating mechanism 240 configured to move the stage 211 up and down. The elevating mechanism 240 raises the conductances of the first exhaust path 30 and the second exhaust path 31 by moving down the stage 211 when the interior of the processing container 209 is cleaned. The ring cover 251 is delivered to the shelf portion 2010 provided on the inner wall of the processing container 209 by moving down the stage 211. Accordingly, it is possible to efficiently remove the organic film adhering to the wall surfaces and the like of the exhaust space $S_E$ and the lower space $S_L$.

Third Embodiment

In the first embodiment, the plate-shaped ring cover 251 is arranged on the stage cover 250 so as to extend along the upper surface of the stage 211. In contrast, a third embodiment differs from the first embodiment in that a cylindrical ring cover 251 is fixed to an outer wall of the shower head 230 so as to surround the shower head 230. Next, differences from the first embodiment will be mainly described.

Figure 12:
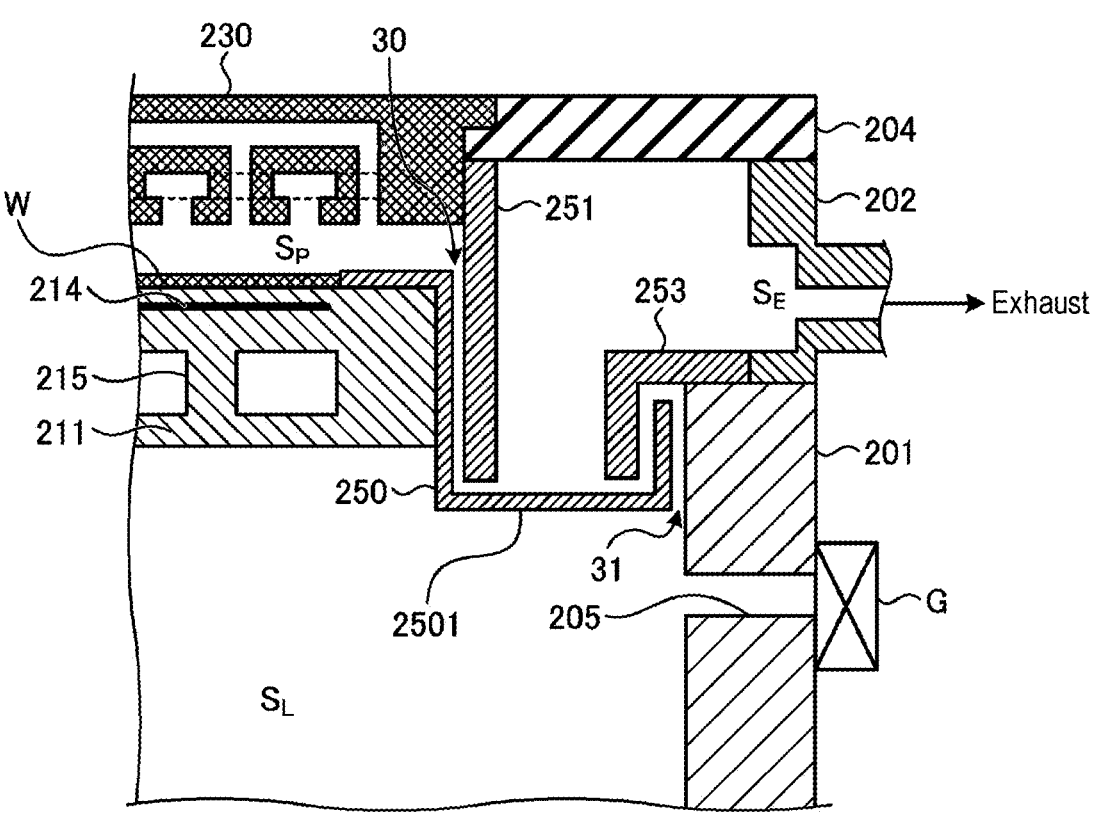
FIG. 12 is an enlarged cross-sectional view showing an example of a structure near a peripheral edge of a stage in a third embodiment.

FIG. 12 is an enlarged cross-sectional view showing an example of a structure near the peripheral edge of the stage 211 in the third embodiment. In the present embodiment, for example, as shown in FIG. 12, the cylindrical ring cover 251 is fixed to the outer wall of the shower head 230 so as to surround the shower head 230. In the present embodiment, a space between the lateral surface of the stage cover 250 provided on the stage 211 and a lateral surface of the ring cover 251 is defined as the first exhaust path 30. The conductance of the first exhaust path 30 is smaller than the conductance of the processing space $S_P$.

Further, in the present embodiment, the annular exhaust blade 253 is provided along the exhaust duct 202. The exhaust blade 253 is an example of the second exhaust blade. For example, as shown in FIG. 12, the exhaust blade 253 has a cross-sectional shape that extends away from the sidewall of the lower container 201 and hangs downward along the sidewall of the lower container 201. In the process of forming an organic film on the substrate W, for example, as shown in FIG. 12, the exhaust blade 2501 of the stage cover 250 is arranged between the exhaust blade 253 and the sidewall of the lower container 201. Gaps are provided between the exhaust blade 253 and the exhaust blade 2501 and between the exhaust blade 2501 and the sidewall of the lower container 201. In the present embodiment, the space between the lower container 201 and the exhaust blade 2501 and the space between the exhaust blades 253 and 2501 are defined as the second exhaust path 31.

Further, in the present embodiment, the conductance of the space between the ring cover 251 and the exhaust blade 253 is larger than the conductance of the processing space $S_P$. In the present embodiment, the relationship between the conductances of the processing space $S_P$, the lower space $S_L$, the exhaust space $S_E$, the first exhaust path 30 and the second exhaust path 31 is, for example, as shown in FIG. 9. In the process of forming an organic film on the substrate W, the gas supplied into the processing space $S_P$ is exhausted to the exhaust space $S_E$ via the first exhaust path 30, and the purge gas supplied to the lower space $S_L$ is exhausted to the exhaust space $S_E$ through the second exhaust port 31.

Further, in the present embodiment, for example, as shown in FIG. 9, the processing space $S_P$ and the exhaust space $S_E$ communicate with each other via the first exhaust path 30 having a low conductance. Therefore, the amount of the purge gas supplied to the lower space $S_L$ and flowing from the exhaust space $S_E$ into the processing space $S_P$ via the first exhaust path 30 may be suppressed at a low level. Accordingly, even if the flow rate of the purge gas supplied to the lower space $S_L$ is increased, the flow rate of the purge gas flowing into the processing space $S_P$ can be suppressed at a low level, thus suppressing the reduction in the film-forming rate of the organic film.

In addition, since the flow rate of the purge gas supplied to the lower space $S_L$ may be increased while suppressing the reduction in the film-forming rate of the organic film, it is possible to reduce the partial pressure of the film-forming gas inside the exhaust space $S_E$. This makes it possible to reduce the concentration of the film-forming gas flowing in the exhaust space $S_E$, thus suppressing the adhesion of the organic film to the sidewall of the exhaust space $S_E$. Accordingly, the frequency of cleaning can be reduced, thus improving the throughput in the film-forming process.

[Operation During Cleaning]

Figure 13:
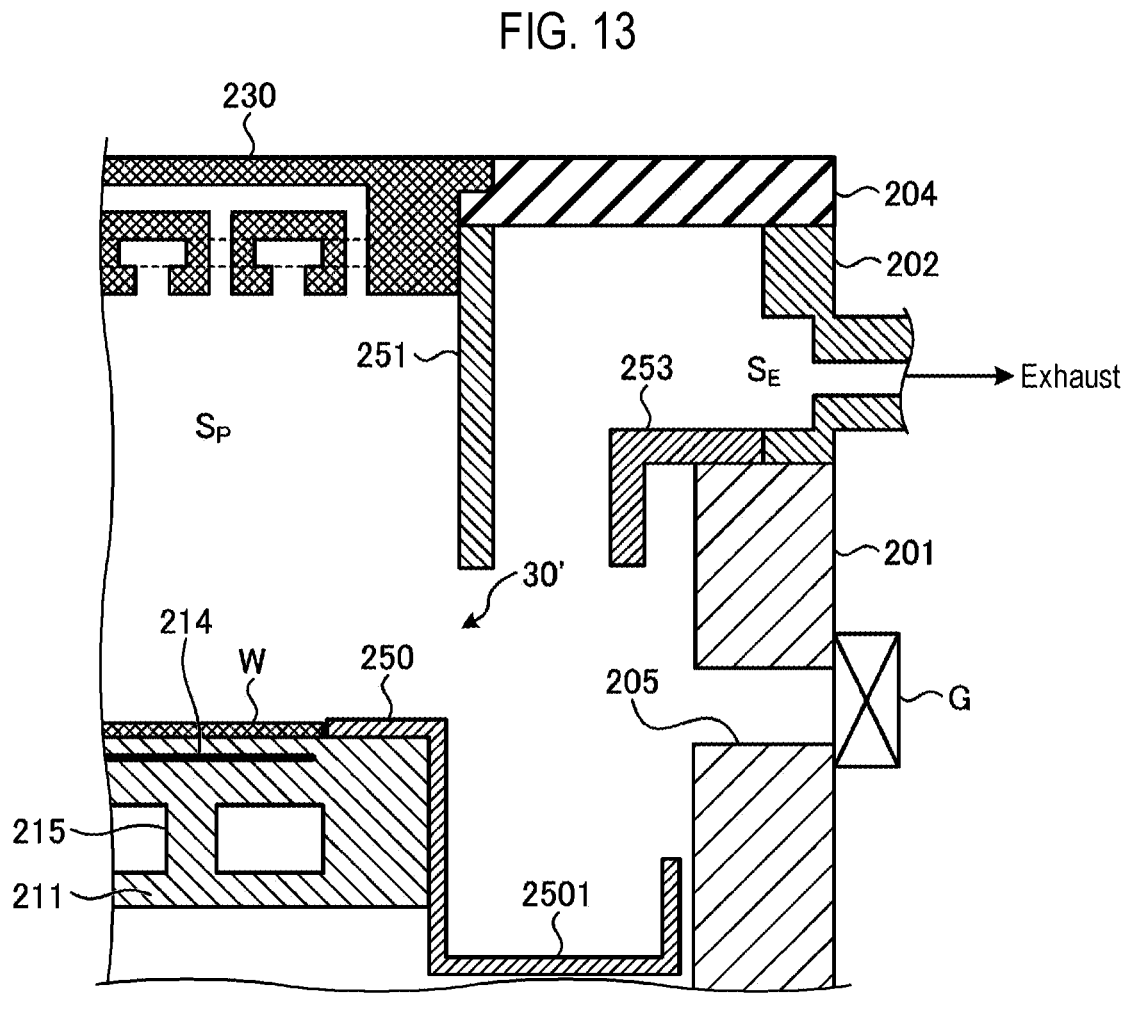
FIG. 13 is an enlarged cross-sectional view showing an example of a state of the peripheral edge of the stage during cleaning in the third embodiment.

FIG. 13 is an enlarged cross-sectional view showing an example of the state near the peripheral edge of the stage 211 during cleaning in the third embodiment. In the present embodiment, the cleaning inside the processing container 209 is performed in a state in which the stage 211 is moved down by driving the elevating mechanism 240. When the stage 211 is moved down from the position where the film-forming process is performed, for example, as shown in FIG. 13, the stage 211 is moved away from the ring cover 251 fixed to the sidewall of the shower head 230. As a result, the space between the lateral surface of the stage 211 and the lateral surface of the ring cover 251 expands to the first exhaust path 30'. Thus, the conductance of the first exhaust path 30' is increased, and the active species of the cleaning gas plasmarized inside the processing space $S_P$ is easily diffused into the exhaust space $S_E$ via the first exhaust path 30'. Accordingly, it is possible to efficiently remove the organic film adhering to the wall surface and the like of the exhaust space $S_E$.

Figure 14:
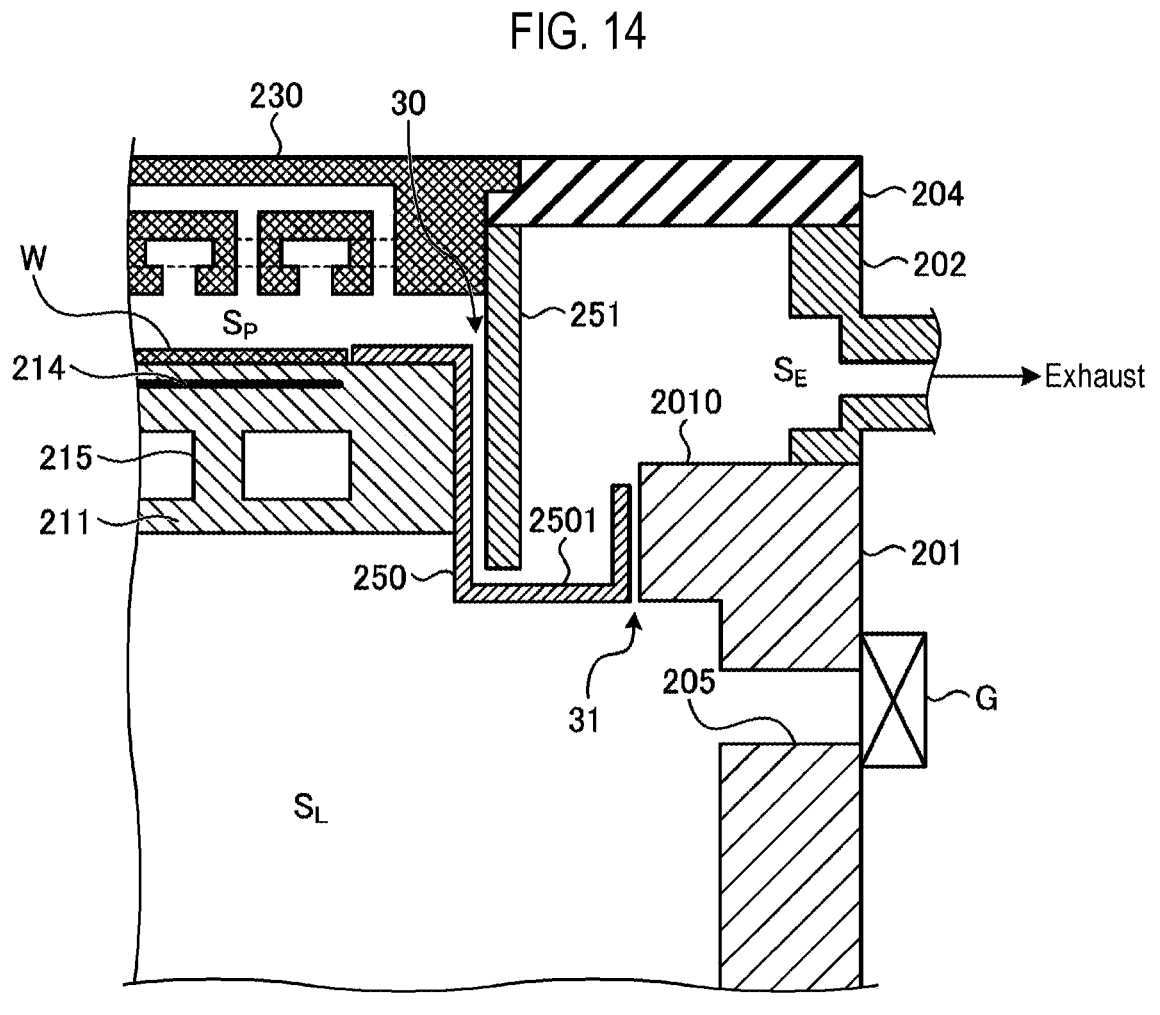
FIG. 14 is an enlarged cross-sectional view showing another example of the structure near the peripheral edge of the stage in the third embodiment.

As another example of the third embodiment, for example, as shown in FIG. 14, instead of the exhaust blade 253, the annular shelf portion 2010 protruding toward the lower space $S_L$ may be formed below the exhaust duct 202 along the sidewall of the lower container 201. In this case, the space between the lateral surface of the shelf portion 2010 and the exhaust blade 2501 corresponds to the second exhaust path 31. Even with such a configuration, the amount of the purge gas supplied to the lower space $S_L$ and flowing from the exhaust space $S_E$ into the processing space $S_P$ via the first exhaust path 30 can be suppressed at a low level, which makes it possible to lower the concentration of the film-forming gas flowing into the exhaust space $S_E$.

Figure 15:
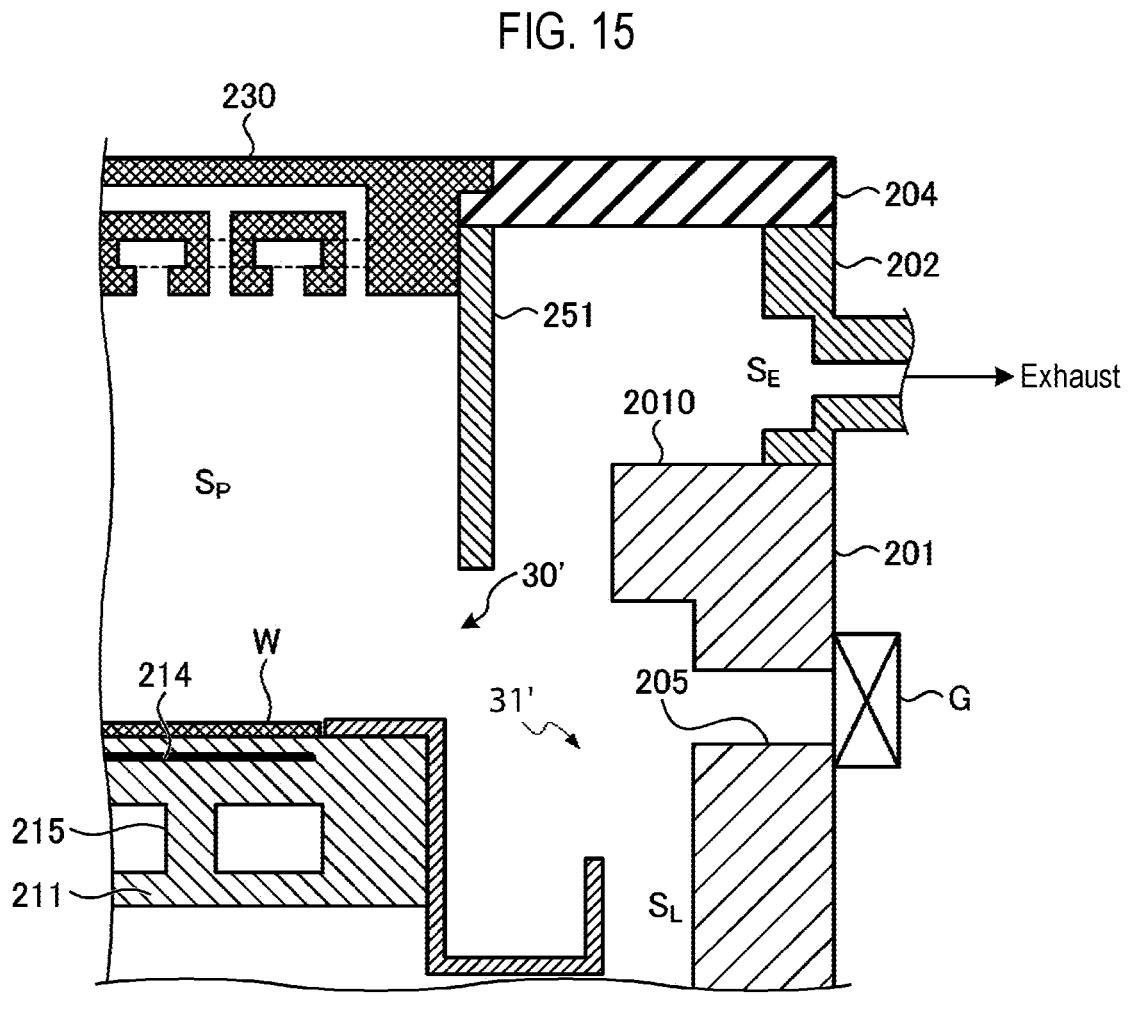
FIG. 15 is an enlarged cross-sectional view showing another example of the state of the peripheral edge of the stage during cleaning in the third embodiment.

During cleaning, the stage 211 is moved down from the position where the film-forming process is performed, whereby for example, as shown in FIG. 15, the stage 211 is moved away from the ring cover 251 fixed to the sidewall of the shower head 230. As a result, the space between the lateral surface of the stage 211 and the lateral surface of the ring cover 251 expands to the first exhaust path 30', thereby increasing the conductance of the first exhaust path 30'. Accordingly, the active species of the cleaning gas plasmarized inside the processing space $S_P$ are easily diffused into the exhaust space $S_E$ via the first exhaust path 30', which makes it possible to efficiently remove the organic film adhering to the wall surface and the like of the exhaust space $S_E$.

Further, the stage 211 and the exhaust blade 2501 are moved away from each other by moving down the stage 211, and the space between the stage 211 and the exhaust blade 2501 expands to the second exhaust path 31'. As a result, the conductance of the second exhaust path 31' is increased, and the active species of the cleaning gas plasmarized inside the processing space $S_P$ are easily diffused into the lower space $S_L$ via the second exhaust path 31'. Accordingly, it is possible to efficiently remove the organic film adhering to the wall surface and the like of the lower space $S_L$.

Figures 16, 17:
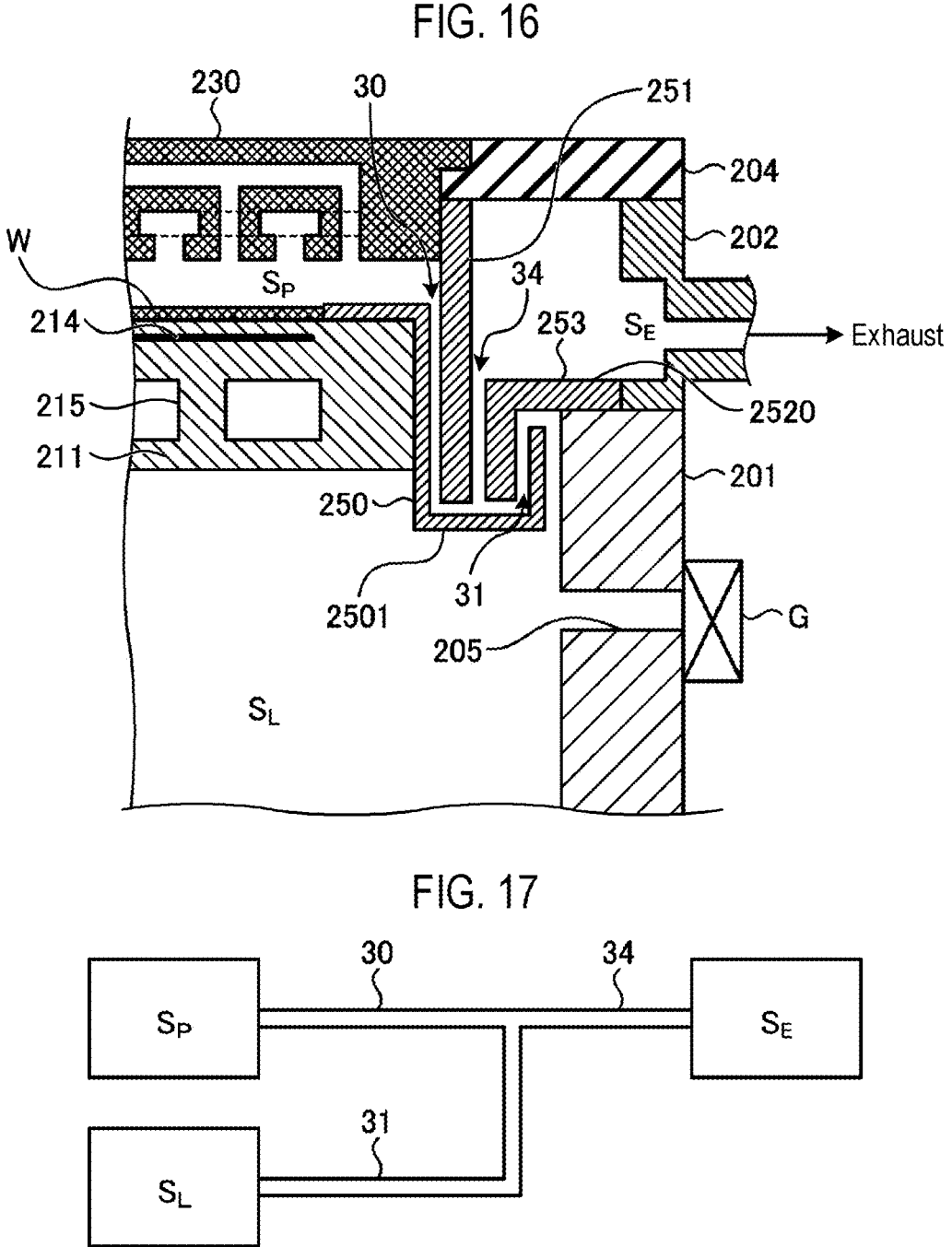
FIG. 16 is an enlarged cross-sectional view showing another example of the structure near the peripheral edge of the stage in the third embodiment.
FIG. 17 is a diagram for explaining an example of a relationship between conductances of respective spaces in another example of the third embodiment.

Further, in the example of FIG. 12, the conductance of the space between the ring cover 251 and the exhaust blade 253 is larger than the conductance of the processing space $S_P$. However, the disclosed technique is not limited thereto. As another example, for example, as shown in FIG. 16, the conductance of the space between the ring cover 251 and the exhaust blade 253 may be set to be smaller than the conductance of the processing space $S_P$. The space between the ring cover 251 and the exhaust blade 253 is defined as a fourth exhaust path 34.

In the example of FIG. 16, a relationship between the conductances of the processing space $S_P$, the lower space $S_L$, the exhaust space $S_E$, the first exhaust path 30, the second exhaust path 31 and the fourth exhaust path 34 is, for example, as shown in FIG. 17. In the present embodiment, for example, as shown in FIG. 17, the second exhaust path 31 is connected to the first exhaust path 30. In the process of forming an organic film on the substrate W, the gas supplied into the processing space $S_P$ flows to the fourth exhaust path 34 via the first exhaust path 30, and the purge gas supplied to the lower space $S_L$ flows to the fourth exhaust path 34 via the second exhaust path 31. Further, the gas flowing in the fourth exhaust path 34 is exhausted to the exhaust space $S_E$.

The third embodiment has been described above. As described above, the substrate processing apparatus 10 according to the present embodiment includes the cylindrical ring cover 251 provided on the sidewall of the shower head 230 so as to surround the shower head 230. The first exhaust path 30 in the present embodiment corresponds to the space between the lateral surface of the annular stage cover 250 provided on the peripheral edge of the upper surface of the stage 211 and the lateral surface of the ring cover 251. Further, the second exhaust path 31 in the present embodiment corresponds to the space between the annular exhaust blade 2501 provided on the stage cover 250 and the annular exhaust blade 253 provided on the sidewall of the processing container 209. This makes it possible to easily form the first exhaust path 30 and the second exhaust path 31.

Further, in the above-described embodiment, the substrate processing apparatus 10 includes the elevating mechanism 240 configured to move the stage 211 up and down. Further, in the present embodiment, the conductance of the space between the lateral surface of the ring cover 251 and the exhaust blade 253 is larger than both the conductance of the first exhaust path 30 and the conductance of the second exhaust path 31. The elevating mechanism 240 raises the conductance of the first exhaust path 30 by moving down the stage 211 when the interior of the processing container 209 is cleaned. This makes it possible to be efficiently remove the organic film adhering to the wall surface and the like of the exhaust space $S_E$ during cleaning.

[Others]

The technique disclosed in the subject application is not limited to the above-described embodiments, and various modifications may be made within the scope of the gist thereof.

For example, in the above-described embodiments, a film of a polymer having urea bonds (—NH—CO—NH—) is formed on the surface of the substrate W by using isocyanate as the first monomer and amine as the second monomer. However, the disclosed technique is not limited thereto. For example, a film of a polymer having 2-aminoethanol bonds (—NH—CH$_2$—CH(OH)—) may be formed on the surface of the substrate W by using epoxide as the first monomer and amine as the second monomer. Alternatively, a film of a polymer having urethane bonds (—NH—CO—O—) may be formed on the surface of the substrate W by using isocyanate as the first monomer and alcohol as the second monomer. Alternatively, a film of a polymer having amide bonds (—NH—CO—) may be formed on the surface of the substrate W by using acyl halide as the first monomer and amine as the second monomer. Alternatively, a film of a polymer having imide bonds (—CO-N(–)—CO—) may be formed on the surface of the substrate W by using carboxylic acid anhydride as the first monomer and amine as the second monomer.

In a case in which a film of a polymer having imide bonds is formed on the surface of the substrate W, for example, pyromellitic dianhydride (PMDA) or the like may be used as the first monomer. Further, in a case in which a film of a polymer having imide bonds is formed on the surface of the substrate W, for example, 4,4'-oxydianiline (44ODA), hexamethylenediamine (HMDA), or the like may be used as the second monomer.

Further, in the above-described embodiments, a film-forming apparatus has been described as an example of the substrate processing apparatus 10. However, the disclosed technique is not limited thereto. In a case in which a distribution of a gas inside the processing container 209 affects a quality of the processing of the substrate W, the disclosed technique may be applied to an etching apparatus, an apparatus for modifying the substrate W, and the like, in addition to the film-forming apparatus.

According to the present disclosure in various aspects and embodiments, it is possible to improve throughput of a substrate processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a processing container;
a stage provided in an interior of the processing container to place a substrate on the stage;
an exhaust space arranged around the stage along an inner wall of the processing container;
a first exhaust path provided between a processing space above the stage and the exhaust space and having a smaller conductance than the processing space; and
a second exhaust path provided between a lower space below the stage and the exhaust space and having a smaller conductance than the processing space,
wherein a processing gas supplied into the processing space is exhausted via the first exhaust path, and a purge gas supplied into the lower space is exhausted via the second exhaust path,
wherein the second exhaust path is connected to the first exhaust path or to a space that is closer to the exhaust space than the first exhaust path,
wherein the first exhaust path is a space between a ring cover arranged on an annular stage cover in contact with a peripheral edge of an upper surface of the stage and a lateral surface of the stage, and a lower surface of a shower head arranged above the stage, wherein the second exhaust path is a space between a first annular exhaust blade and a second annular exhaust blade,
wherein the first annular exhaust blade extends from the annular stage cover to have a first annular vertical distal end which extends parallel to the inner wall of the processing container while forming a first gap with the inner wall, and
wherein the second annular exhaust blade is provided on a sidewall of the processing container at one end of the second annular exhaust blade and has a second annular vertical distal end at the other end extending parallel to the inner wall while forming a second gap with the first annular vertical distal end.

2. The substrate processing apparatus of claim 1, further comprising:
a driver configured to move the stage up and down,
wherein the driver raises a conductance of the first exhaust path by moving down the stage when the interior of the processing container is cleaned, and
the ring cover is delivered from the annular stage cover to the second annular exhaust blade as the stage is moved down.

3. The substrate processing apparatus of claim 1, further comprising:
a gas supplier configured to, in a state in which the substrate is placed on the stage, supply a first processing gas containing a first monomer and a second processing gas containing a second monomer into the processing space through a shower head arranged above the stage via different discharge ports of the shower head, and configured to form a film of a polymer of the first monomer and the second monomer on the substrate.

4. The substrate processing apparatus of claim 3, wherein the first monomer is isocyanate, the second monomer is amine, and the polymer formed on the substrate contains urea bonds.

5. The substrate processing apparatus of claim 3, wherein the first monomer is carboxylic anhydride, the second monomer is amine, and the polymer formed on the substrate contains imide bonds.

6. The substrate processing apparatus of claim 3, wherein the first monomer is epoxide, the second monomer is amine, and the polymer formed on the substrate contains 2-aminoethanol bonds.

7. The substrate processing apparatus of claim 3, wherein the first monomer is isocyanate, the second monomer is alcohol, and the polymer formed on the substrate contains urethane bonds.

8. The substrate processing apparatus of claim 3, wherein the first monomer is acyl halide, the second monomer is amine, and the polymer formed on the substrate contains amide bonds.

* * * * *